United States Patent
Paek et al.

(10) Patent No.: US 7,045,893 B1
(45) Date of Patent: May 16, 2006

(54) SEMICONDUCTOR PACKAGE AND METHOD FOR MANUFACTURING THE SAME

(75) Inventors: Jong Sik Paek, Gyeonggi-do (KR); Kwang Eung Lee, Seoul (KR); Seung Ju Lee, Gyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/892,625

(22) Filed: Jul. 15, 2004

(51) Int. Cl.
*H01L 23/48* (2006.01)
*H01L 23/52* (2006.01)
*H01L 29/40* (2006.01)

(52) U.S. Cl. .................... 257/737; 257/778; 257/780; 257/773; 257/786; 257/692

(58) Field of Classification Search ................ 257/778, 257/737, 773, 786, 692, 780, 738
See application file for complete search history.

(56) References Cited

U.S. PATENT DOCUMENTS

| | | | | |
|---|---|---|---|---|
| 5,347,086 A | * | 9/1994 | Potter et al. ................. | 174/261 |
| 5,477,086 A | * | 12/1995 | Rostoker et al. ............ | 257/737 |
| 6,184,061 B1 | * | 2/2001 | Wu et al. .................... | 438/106 |
| 6,239,385 B1 | * | 5/2001 | Schwiebert et al. ........ | 174/261 |
| 6,429,046 B1 | * | 8/2002 | Marlin ........................ | 438/108 |

* cited by examiner

*Primary Examiner*—Nitin Parekh
(74) *Attorney, Agent, or Firm*—Gunnison, McKay & Hodgson, L.L.P.; Philip J. McKay

(57) ABSTRACT

A semiconductor package, and a method for fabricating the semiconductor package, includes a semiconductor die having a plurality of bond pads including a first bond pad positioned at a center of the bond pad and formed at a first surface of the semiconductor die and a second bond pad spaced from the first bond pad by a predetermined distance while surrounding the first bond pad. The semiconductor package includes first and second posts formed on the bond pads of the semiconductor die and a substrate formed with electrically conductive patterns corresponding to the bond pads of the semiconductor die and bonded to the post.

17 Claims, 8 Drawing Sheets

US 7,045,893 B1

SEMICONDUCTOR PACKAGE AND METHOD FOR MANUFACTURING THE SAME

FIELD OF THE INVENTION

The present invention relates to semiconductor packages having high pin counts and a method for their manufacture.

BACKGROUND OF THE INVENTION

Recently, manufacturers have started using PCB (Printed Circuit Board) to replace lead frames in semi-conductor packages to reduce inductance, improve electrical performance, improve heat-emission performance and improve surface-mounting performance for the semiconductor package.

When the PCB used in the semiconductor package includes a thermosetting resin layer, which is a base layer, a plurality of copper wiring patterns are formed on upper and lower surfaces of the base layer, and a solder mask coating is formed on the copper wiring patterns.

In order to form the semiconductor package by mounting a die on the PCB, a solder ball is welded between the copper wiring patterns of the PCB and a bonding pad of the die such that the copper wiring patterns are electrically connected to the bonding pad of the die. For instance, a wafer level package and a flip-chip assembly package may be fabricated through the above semiconductor fabrication method using a solder ball. To form a wafer level package, a solder ball is mounted on a pattern of a die. In addition, for the flip-chip assembly package, a die is mounted on a PCB after a solder ball has been mounted on the die, and the die is molded by an encapsulant, thereby forming the flip-chip assembly package. When packaging the die, it is necessary to obtain a high Input/Output (I/O) count for a given package size.

However, in order to allow the die to withstand external stress applied to the die during the packaging process, it is necessary to use a solder ball having a proper size. Consequently, there is a physical limitation for increasing the I/O count. That is, a smaller number of bond pads may have to be formed even if the die has a sufficient area for more.

SUMMARY OF THE INVENTION

The present invention is directed to a semiconductor package and a method for creating the same. According to the invention, a semiconductor package includes a semiconductor die with a first surface having an approximately planar shape and a second surface, opposite the first surface, and having a plurality of bond pads, each bond pad including a first bond pad formed at a center of the bond pad and a second bond pad spaced from the first bond pad by a predetermined distance and at least partially surrounding the first bond pad.

According to the invention, the semiconductor package includes a substrate including a first surface having an approximately planar shape and a second surface opposite the first surface, the first surface of the substrate being formed with a plurality of electrically conductive patterns having shapes corresponding to shapes of the bond pad.

According to the invention, a plurality of two-part posts are formed including a first, or inner, post formed on the first bond pad and a second, or outer, post formed on the second bond pad and bonded to the electrically conductive patterns of the substrate so as to electrically connect the substrate to the semiconductor die.

In one embodiment of the invention, the semiconductor package of the invention includes an encapsulant formed on the first surface of the substrate. In one embodiment of the invention, the first bond pad of the semiconductor die has a substantially circular sectional shape and the second bond pad of the semiconductor die has a substantially ring shape having a predetermined width. In one embodiment of the invention an opening is formed in the second bond pad.

In one embodiment of the invention, a UBM layer is formed on a surface of the bond pad and a solder layer is formed on a surface of the post and surfaces of the electrically conductive patterns of the substrate, respectively. In one embodiment of the invention, an internal insulative layer is formed between the first post and the second post and an external insulative layer formed at an outer portion of the second post.

In one embodiment of the invention, first and second electrically conductive patterns of the substrate have shapes corresponding to shapes of the first and second bond pads of the semiconductor die.

Since, according to the present invention, the posts have two parts, a first, or inner, post and second, or outer, post, the strength of the post is greater than that of a conventional solder ball. Consequently, the post has superior endurance, reliability and lifetime. In addition, since each of the first, or inner, posts and the second, or outer, posts may be used as an individual signal line, a greater number of signal lines can be formed. Accordingly, a greater number of I/O counts can be formed in a semiconductor die created in accordance with the present invention.

In addition, if the second, or outer, post is used as a ground line, other than a signal transmission line, the second post may act as a shield line for the first, or inner, post. Therefore, the posts of the invention may reduce impedance when transmitting signals while achieving superior electrical performance in RF devices, high-speed operational devices, and high-power RF devices. Prior to the present invention, there have only been proposed methods capable of reducing impedance in the substrate when packaging the RF devices. However if, in accordance with one embodiment of the invention, the two-part post is used, impedance can be reduced in interconnection parts.

BRIEF DESCRIPTION OF THE DRAWINGS

Common reference numerals are used throughout the drawings and the detailed description to indicate the same or similar elements.

DETAILED DESCRIPTION

Figure 1:
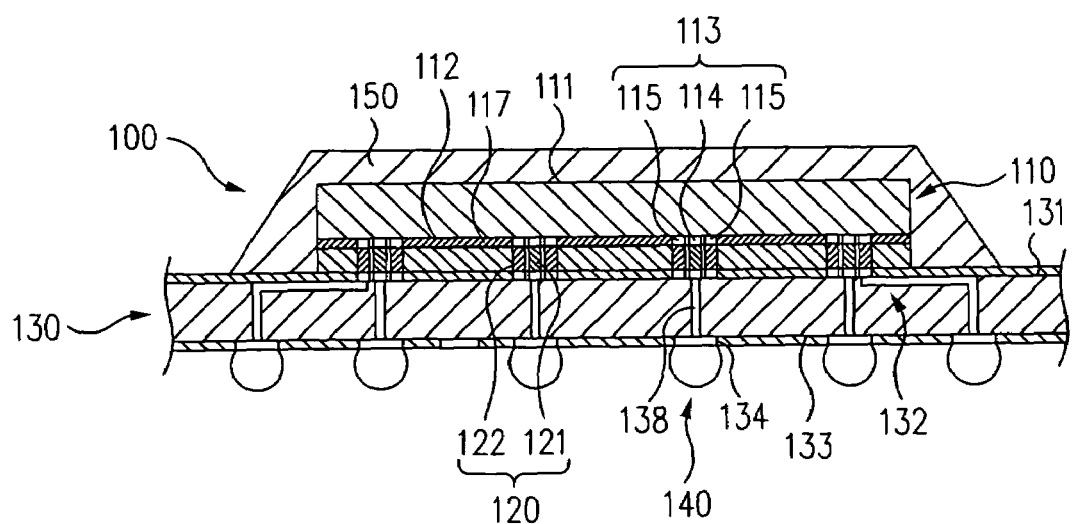
FIG. 1 is a sectional view showing a flip-chip assembly package according to one exemplary embodiment of the present invention.

FIG. 1 shows a sectional view of a flip-chip assembly package 100 according to one exemplary embodiment of the present invention.

As shown in FIG. 1, flip-chip assembly package 100 according to the present invention includes a semiconductor die 110, a plurality of posts 120 formed respectively in a plurality of bond pads 113 of the semiconductor die 110, a substrate 130 having electrically conductive patterns 132 and 134 bonded to end portions of posts 120, and a plurality of solder balls 140 welded to a lower surface of substrate 130. In addition, flip-chip assembly package 100 has an encapsulant 150 formed on an upper surface of substrate 130 and surrounding semiconductor die 110 and posts 120.

Semiconductor die 110 has a first surface 111 having an approximately planar shape and a second surface 112 formed in opposition to first surface 111 and having an approximately planar shape. Second surface 112 of semiconductor die 110 is formed with bond pads 113. Bond pads 113 electrically connect integrated circuits (not shown) formed in semiconductor die 110 to external devices. Each of the bond pads 113 formed on second surface 112 of semiconductor die 110 includes a first bond pad 114 and a second bond pad 115. In addition, a BCB layer 117, which is an insulation layer, may be formed on a predetermined portion of second surface 112 of semiconductor die 110, in which bond pads 113 are not formed.

Each of the posts 120 includes a first post 121 formed at a center of post 120 and having a column-like shape, and a second post 122 spaced from first post 121 by a predetermined distance while surrounding first post 121. First post 121 is formed in first bond pad 114 of semiconductor die 110, and second post 122 is formed in second bond pad 115 of semiconductor die 110. Post 120 is made from materials having electric conductivity, such as Cu, Al, Au or the like. However, the present invention does not limit the sorts of materials for the post 120 to those specifically listed above.

Substrate 130 has a first surface 131 having an approximately planar shape and a second surface 133 formed in opposition to first surface 131 and having an approximately planar shape. Substrate 130 includes a printed circuit board, a circuit film, a circuit tape, a lead frame, or the like. However, the present invention does not limit the sort of the substrate to be used to those specifically listed above.

First surface 131 of substrate 130 is formed with electrically conductive pattern 132, to which the posts 120 are bonded, and second surface 133, formed in opposition to first surface 131, is formed with the electrically conductive patterns 134. In addition, a plurality of conductive via holes 138 are formed in substrate 130 in order to electrically connect electrically conductive pattern 132 formed on the first surface 131 of the substrate 130 to the electrically conductive patterns 134 formed on second surface of substrate 130. Electric insulation layers are provided on surfaces of the electrically conductive patterns 132 and 134 formed on first and second surfaces 131 and 133 of the substrate 130.

Solder balls 140 are welded to conductive patterns 134 formed on second surface 133 of substrate 130. Solder balls 140 are surface-mounted on an external device (not shown) in order to electrically connect semiconductor package 100 to an external device (not shown), so that semiconductor package 100 can make signal-communication with the external device.

Encapsulant 150 surrounds semiconductor die 110, and the posts 120 fixed to the first surface 131 of the substrate 130, in order to protect semiconductor die 110 and posts 120 from the external environment. Encapsulant 150 may be formed in various shapes depending on a mounting status of semiconductor die 110. However, encapsulant 150 is not necessarily required. As generally known in the art, encapsulant 150 can be formed by injecting high-temperature and high-pressure encapsulating materials into a cavity of an upper mold (not shown) in a state in which the upper mold having the cavity positioned in an area corresponding to the semiconductor die 110 covers substrate 130 positioned in a lower mold.

Figure 2:
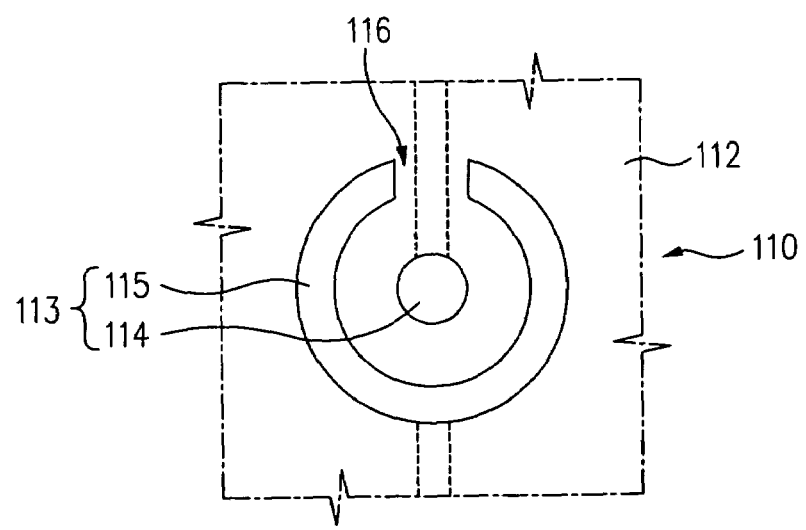
FIG. 2 is a partial bottom view of a die formed with a pattern corresponding to a shape of a post used in a package according to one exemplary embodiment of the present invention.

FIG. 2 is a partial bottom view of the semiconductor die used in a package according to one exemplary embodiment of the present invention.

As shown in FIG. 2, each of the bond pads 113 formed on second surface 112 of the semiconductor die 110 includes first bond pad 114 and second bond pad 115. First bond pad 114 has a circular sectional shape and is formed at a center of bond pad 113. Second bond pad 115 is spaced from first bond pad 114 by a predetermined distance while surrounding first bond pad 114. In one embodiment of the invention, when first bond pad 114 has a circular sectional shape, second bond pad 115 has a ring shape. In addition, a predetermined portion of second bond pad 115 can be cut away so that an opening 116 may be formed in second bond pad 115. First bond pad 114 extends out of second bond pad 115 through opening 116 for establishing an electrical connection while being electrically insulated from second bond pad 115. At this time, a surface of first bond pad 114 extending out of second bond pad 115 is electrically insulated by means of the BCB layer formed on second surface 112 of semiconductor die 110.

Meanwhile, if first bond pad 114 extends into semiconductor die 110, it is not necessary to form opening 116 in second bond pad 115.

The shape of bond pad 113 is not limited to the shape shown in FIG. 2. Bond pad 113 may be formed with various sectional shapes, such as a rectangular sectional shape or a hexagonal sectional shape as well as the circular sectional shape. In addition, second bond pad 115 may be formed with various shapes, such as a tetrahedral ring shape or a hexahedral ring shape, as well as the circular ring shape. Also, the thickness of second bond pad 115 can be varied as desired. Accordingly, as mentioned above, if first bond pad 114 has the rectangular sectional shape, it is possible to form second bond pad 115 with the tetrahedral ring shape. Of course, second bond pad 115 may be formed with the tetrahedral ring shape even if first bond pad 114 has the circular sectional shape.

In addition, a UBM layer is formed on the surfaces of first and second bond pads 114 and 115 in order to facilitate bonding work with respect to the posts 120.

Figure 3:
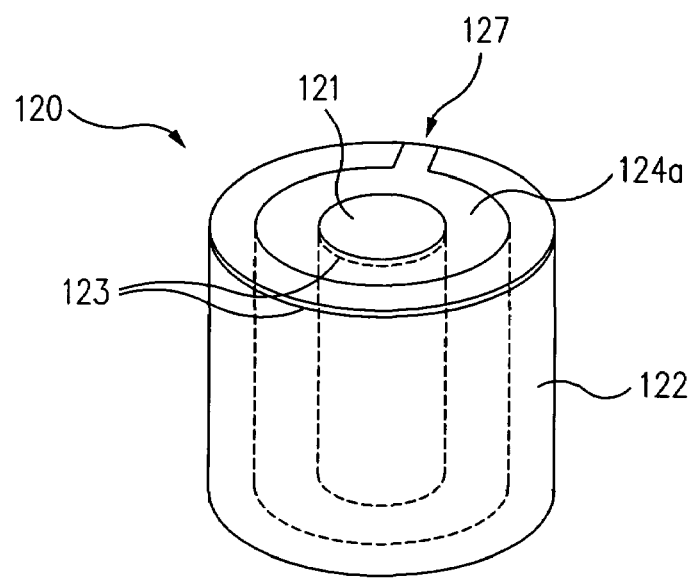
FIG. 3 is a perspective view showing a post formed in a package according to one exemplary embodiment of the present invention.
Figure 4:
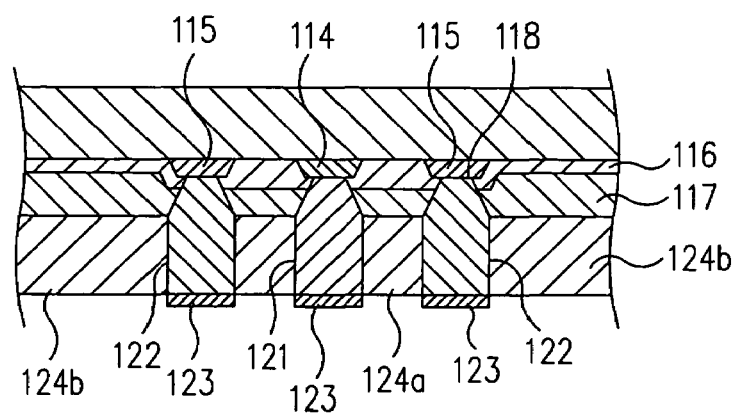
FIG. 4 is a sectional view showing a die having a post used in a package according to one exemplary embodiment of the present invention.

FIG. 3 is a perspective view showing post 120 formed in a package according to one exemplary embodiment of the present invention and FIG. 4 is a sectional view of post 120 formed in the second surface of the semiconductor die used in the package according to one exemplary embodiment of the present invention.

As shown in FIGS. 3 and 4, post 120 includes first post 121 formed at the center of post 120 and second post 122 positioned around first post 121. Accordingly, a predetermined space is formed between first post 121 and second post 122. Post 120 is formed in bond pad 113 of semiconductor die 110, so post 120 has a sectional shape identical the sectional shape of bond pad 113. According to one embodiment, first post 121 has a circular column structure having a predetermined height and diameter, and second post 122 has a cylindrical structure spaced from first post 121 by a predetermined distance while surrounding first post 121. The height of second post 122 is identical to that of first post 121. In one embodiment, post 121 is made from conductive metals, such as Cu, Ni, Au, Ag or the like, with a thickness about 50 to 200. In addition, an opening 127 is formed at a predetermined location of second post 122 corresponding to bond pad 113.

Of course, first and second posts 121 and 122 may be formed with various shapes according to the shapes of first and second bond pads 114 and 115.

A solder layer 123 having a predetermined thickness is applied on a surface of post 120 to allow post 120 to be easily bonded to electrically conductive pattern 132 of the substrate 130.

In one embodiment, insulation materials are filled in the space formed between first post 121 and second post 122, thereby forming an internal insulative layer 124*a* for electrically insulating first post 121 from second post 122.

As shown in FIG. 4, first and second bond pads 114 and 115, which are made from Al, Cu or the like, are formed in second surface 112 of semiconductor die 110, and a nitride layer 116 and BCB layer 117 are formed between first and second bond pads 114 and 115 to electrically insulate first bond pad 114 from second bond pad 115. In addition, a UBM layer 118 having a thickness of few micrometers is formed on the surfaces of the first and second bond pads 114 and 115 in order to allow post 120 to be easily bonded to first and second bond pads 114 and 115. UBM layer 118 may improve the bonding force between first and second bond pads 114 and 115 and post 120 formed on first and second bond pads 114 and 115. UBM layer 118 may extend the circuit patterns of first and second bond pads 114 and 115 towards a predetermined position, if necessary.

First post 121 and second post 122 have a predetermined height and are formed on the surfaces of first and second bond pads 114 and 115, respectively. A predetermined space is formed between first post 121 and second post 122. Solder layer 123, having a predetermined thickness, is formed on surfaces of first post 121 and second post 122. In addition, insulation materials are filled in the space between first post 121 and second post 122, thereby forming internal insulative layer 124*a*. An external insulative layer 124*b* is formed at an outer portion of post 120 so as to electrically insulate post 120 while supporting post 120. External insulative layer 124*b* is made from a material identical to that of internal insulative layer 124*a*. In one embodiment, internal insulative layer 124*a* and external insulative layer 124*b* are simultaneously formed through one process.

Insulation layers 124*a* and 124*b* support post 120, protect post 120 and electrically insulate post 120. Insulation layers 124*a* and 124*b* can be formed by using materials having an electrical insulation property, such as polyamide or epoxy. However, the present invention does not limit the materials for the insulation layers 124*a* and 124*b* to those mentioned above.

Since post 120 has two layers of first post 121 and second post 122, the strength of post 120 is greater than that of a conventional solder ball. Consequently, post 120 has superior endurance, reliability and lifetime. In addition, since each of first post 121 and second post 122 may be used as an individual signal line, a greater number of signal lines can be formed. Accordingly, a greater number of I/O counts can be formed in semiconductor die 110.

In addition, if second post 122 of post 120 is used as a ground line, other than a signal transmission line, second post 122 may act as a shield line for first post 121. Therefore, post 120 may reduce impedance when transmitting signals while achieving superior electrical performance in RF devices, high-speed operational devices, and high-power RF devices. Until now, there have been proposed methods capable of reducing impedance only in the substrate 130 when packaging the RF devices. However if, in accordance with one embodiment of the invention, post 120 is used, impedance can be reduced in interconnection parts.

Figure 5:
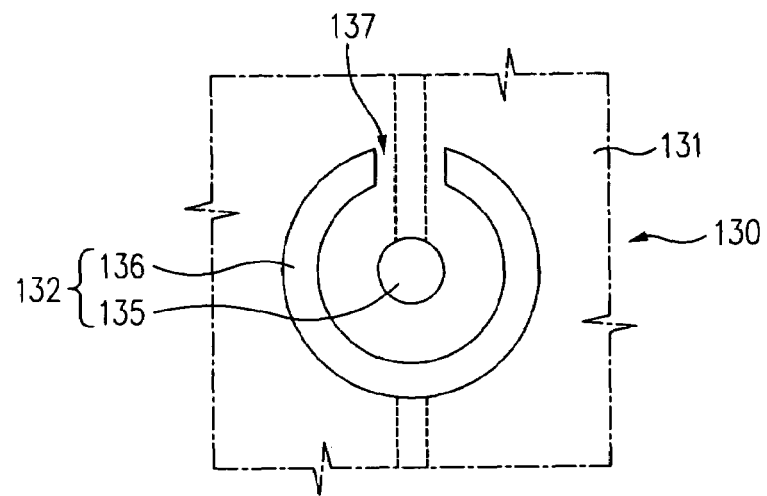
FIG. 5 is a partial plan view of a substrate used in a package according to one exemplary embodiment of the present invention.

FIG. 5 is a plan view showing the substrate used in a package according to one exemplary embodiment of the present invention.

As shown in FIG. 5, substrate 130 is formed at first surface 131 with electrically conductive pattern 132, to which the post 120 is bonded, and electrically conductive pattern 132 has a shape corresponding to the shape of post 120 or bonding pad 113 of semiconductor die 110. That is, electrically conductive pattern 132 includes a first electrically conductive pattern 135 formed at a center of electrically conductive pattern 132 and a second electrically conductive pattern 136 spaced from first electrically conductive pattern 135 by a predetermined distance while surrounding electrically conductive pattern 135.

First and second electrically conductive patterns 135 and 136 can be formed in the same plane. In this case, similar to second bonding pad 115 of semiconductor die 110, a predetermined portion of second electrically conductive pattern 136 is cut away, thereby forming opening 137. First electrically conductive pattern 135 extends out of second electrically conductive pattern 136 through opening 137 while being electrically insulated from second electrically conductive pattern 136. At this time, an extension of first electrically conductive pattern 135 is electrically insulated by means of an insulative layer formed on upper surface of the substrate 130.

Meanwhile, similar to bond pad 113 of semiconductor die 110, if first electrically conductive pattern 135 extends into substrate 130, it is not necessary to form opening 137 in second electrically conductive pattern 136.

In addition, electrically conductive pattern 132 is, in one embodiment, typically made from copper and is typically formed at a surface thereof with a solder layer (not shown) having a shape corresponding to the shape of post 120 in order to allow post 120 to be easily bonded to electrically conductive pattern 132.

Figure 6:
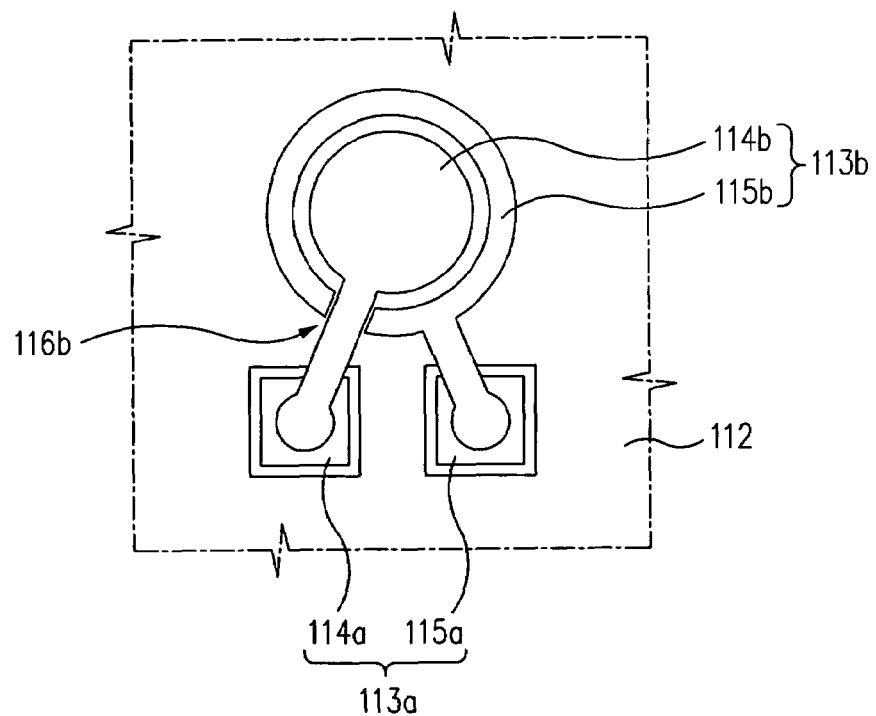
FIG. 6 is a partial bottom view of a die having a post provided in a package according to another embodiment of the present invention.

FIG. 6 shows a partial bottom view of a semiconductor die having a post provided in a package according to another embodiment of the present invention.

As shown in FIG. 6, bond pad 113*a* formed on second surface 112 of semiconductor die 110 includes a first bond pad 114*a* and a second bond pad 115*a*.

A conductive pattern 113*b*, which is a redistribution layer (hereinafter, simply referred to as "RDL") connected to bond pad 113*a*, is formed at a lower surface of semiconductor die 110 spaced from bond pad 113*a* by a predetermined distance. Conductive pattern 113*b* includes a first conductive pattern 114*b* and a second conductive pattern 115*b*. First conductive pattern 114*b* is formed at a center of conductive pattern 113*b* in a circular pattern, and second conductive pattern 115*b* is formed around first conductive pattern 114*b* in order to surround first conductive pattern 114*b* while being spaced from first conductive pattern 114*b* by a predetermined distance. Second conductive pattern 115*b* has formed at a predetermined portion thereof an opening 116*b*. First conductive pattern 114*b* is electrically insulated from second conductive pattern 115*b* and extends out of second conductive pattern 115*b* through opening 116*b*.

First conductive pattern 114*b* is electrically connected to first bond pad 114*a*, and second conductive pattern 115*b* is electrically connected to second bond pad 115*a*.

In addition, post 120 is formed at an upper portion of conductive pattern 113*a* so that conductive pattern 113*a* is connected to electrically conductive pattern 132 of substrate 130. That is, first conductive pattern 114*b* is formed at a surface thereof with a first post 121 of post 120 and second conductive pattern 115*b* is formed with a second post 122 of post 120, so that the first and second conductive patterns are electrically connected to electrically conductive pattern 132 of substrate 130. In addition, a UBM layer 118, having a typical thickness of a few micrometers, may be formed on surfaces of first and second conductive patterns 114*b* and 115*b*, respectively, in order to allow post 120 to be easily bonded to the surfaces of first and second conductive patterns 114*b* and 115*b*.

According to one embodiment, the RDL can be effectively formed on the lower surface of the semiconductor die.

In addition, when first bond pad 114*a* is used as a signal transmission line and second bond pad 115*a* is used as a ground line, second conductive pattern 115*b* acts as a shield line, so not only is impendence lowered when transmitting signals, but also electrical performance of RF devices, high-speed operational device, and high-power RF devices can be improved.

Figure 7:
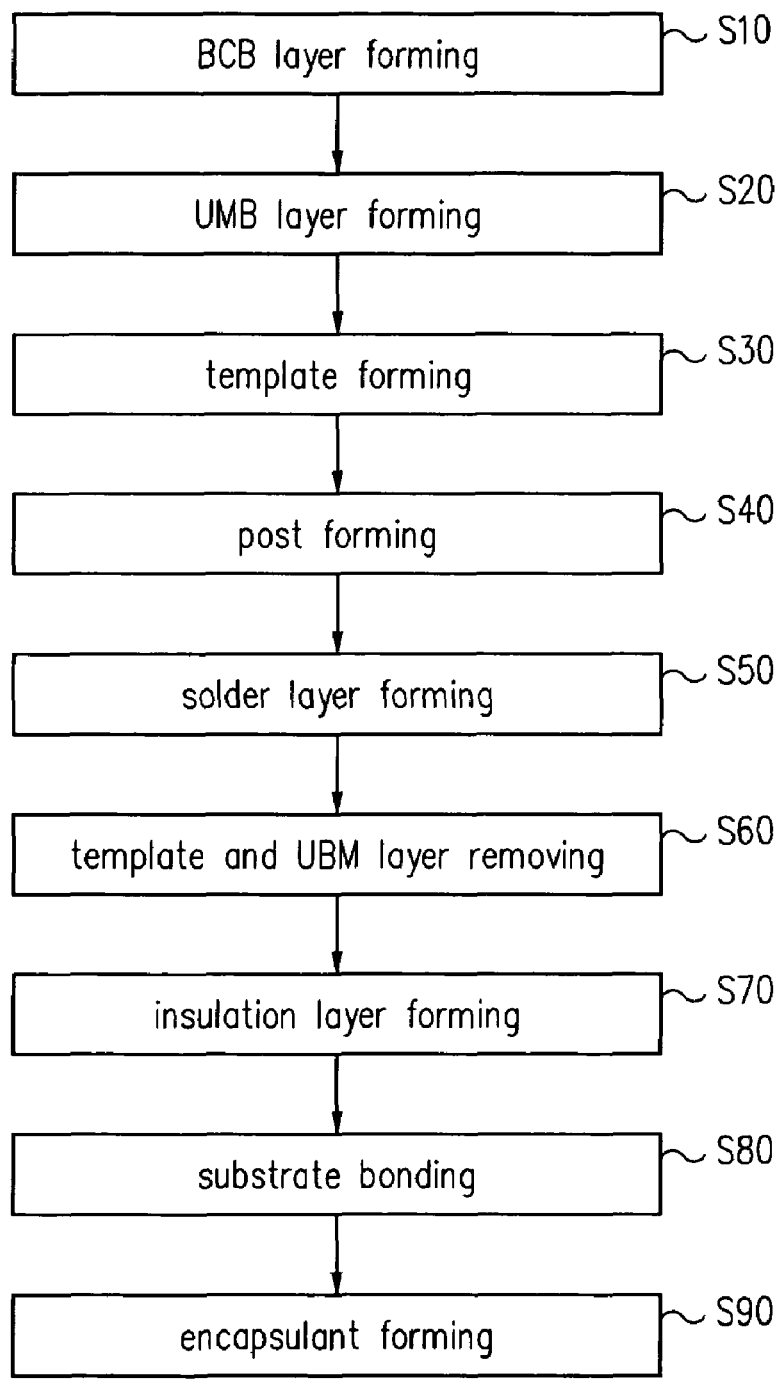
FIG. 7 is a block view showing a manufacturing procedure of a package according to one exemplary embodiment of the present invention.

FIG. 7 is a block view showing a manufacturing process of a package according to one exemplary embodiment of the present invention and FIG. 8A to FIG. 8I are schematic sectional views showing manufacturing sub-processes for the package according to one exemplary embodiment of the present invention.

As shown in FIG. 7, a method for forming post 120 includes forming the BCB layer (S10), forming the UBM layer (S20), forming a template (S30), forming the post (S40), forming the solder layer (S50), removing the template and the UBM layer (S60), forming the insulative layer (S70), bonding the substrate (S80), and forming the encapsulant (S90).

Bond pad 113, electrically connected to an internal IC, is formed on the second surface 112 of the semiconductor die 110 for manufacturing a flip-chip assembly package according to the present invention. In addition, a protective layer 116 is formed on predetermined portions of second surface 112 of semiconductor die 110, in which bond pad 113 is not formed, to protect semiconductor die 110 from the external environment. Protective layer 116 is typically formed as a nitride layer.

Figure 8A:
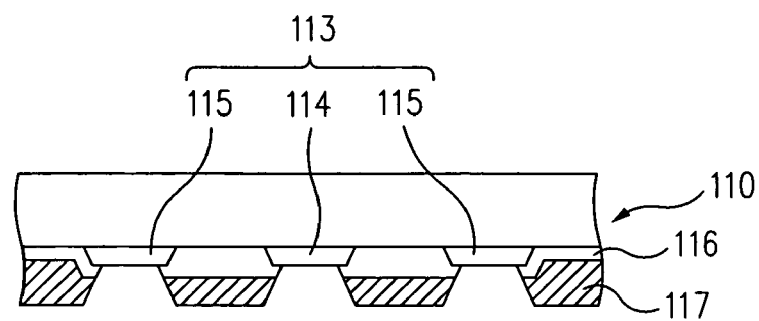
FIG. 8A to FIG. 8I are schematic sectional views showing an exemplary manufacturing process for a package according to one embodiment of the present invention.

As shown in FIG. 8A, at sub-process S10 for forming the BCB layer, nitride layer 116 is formed on semiconductor die 110 in order to protect semiconductor die 110, and BCB layer 117 is formed on semiconductor die 110 so as to electrically insulate semiconductor die 110. BCB layer 117 may include photosensitive polymer material, such as polyimide, polybenzoxazole, as well as BCB, so that BCB layer 117 is formed as a photosensitive polymer layer. In order to form BCB layer 117, photosensitive BCB is coated on second surface 112 of semiconductor die 110 with a predetermined thickness, and then, photosensitive BCB formed on second surface 112 of semiconductor die 110 is subject to an exposure process in such a manner that bond pad 113 is exposed.

Figure 8B:
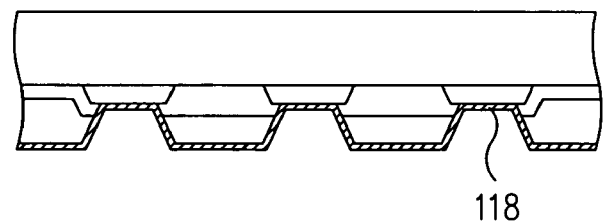

As shown in FIG. 8B, at sub-process S20 for forming the UBM (Under Bumped Metallurgy) layer, a metal layer, in one embodiment including Ti and Cu as main components, is formed on a surface of BCB layer 117 of semiconductor die 110. At S20, UBM layer 118 is formed on the surface of BCB layer 117 through a sputtering process, a deposition process or a coating process. Then, after a post forming process has been carried out, UBM layer 118 is removed from semiconductor die 110 through an etching process except for the parts of UBM layer 118 formed on a predetermined portion of semiconductor die 110 corresponding to bond pad 113.

Figure 8C:
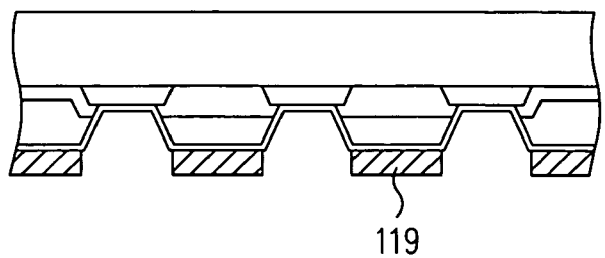

As shown in FIG. 8C, at sub-process S30 for forming template 119, an anti-coating layer is formed on UBM layer 118 except for predetermined parts of UBM layer 118 in which post 120 will be formed. Firstly, template 119 is formed over the whole area of UBM layer 118. Then, parts of template 119 formed on the predetermined parts of UBM layer 118, in which post 120 will be formed, are removed through an exposure process. In one embodiment, template 119 includes general photoresist material and is formed with a thickness of about 50 to 200 microns.

Figure 8D:
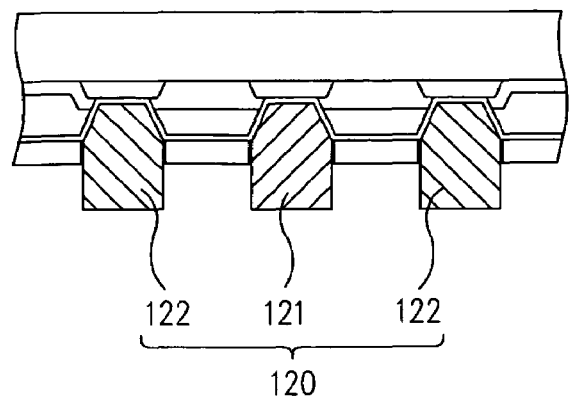

As shown in FIG. 8D, at sub-process S40, post 120 is formed on UBM layer 118 of semiconductor die 110. Post 120 is formed on a surface of UBM layer 118 with a predetermined thickness through an electro-plating process. As mentioned above, post 120 can be made from metals having electric conductivity, such as Cu, Au, Ag or the like. However, the present invention does not limit the material for post 120 to those specifically disclosed.

Figure 8E:
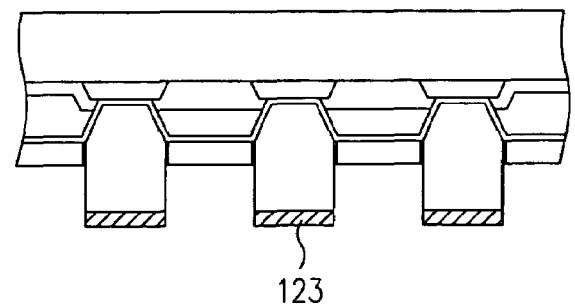

As shown in FIG. 8E, sub-process S50 is for forming solder layer 123 on a lower surface of post 120 in order to allow post 120 to be easily bonded to electrically conductive pattern 132 of substrate 130. Solder layer 123 is formed through the electro-plating process in the same manner as post 120, as discussed above.

Figure 8F:
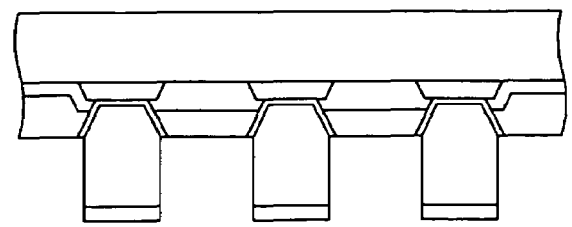

As shown In FIG. 8F, sub-process S60 is carried out in order to remove template 119 and UBM layer 118 from semiconductor die 110. That is, after solder layer 123 has been formed on lower surface of post 120, template layer 119 and UBM layer 118, in which post 120 is not formed, are removed through an etching process by using predetermined chemical solution or chemical gas.

Figure 8G:
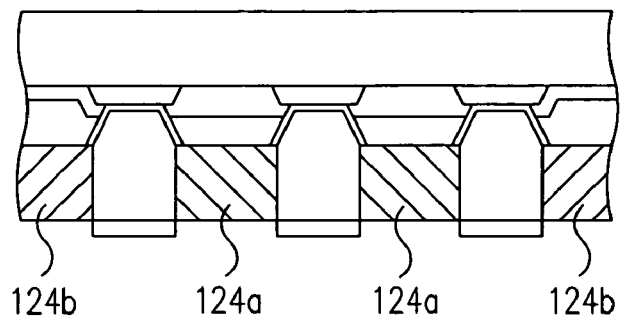

As shown in FIG. 8G, sub-process S70 is carried out for forming the insulation layer. At S70, insulation materials are coated on BCB layer 117 with a predetermined thickness slightly smaller than a thickness of post 120 except for the predetermined parts of BCB layer 117 in which post 120 is formed, thereby forming insulation layers. As mentioned above, the insulation layers include internal insulative layer 124*a* formed at an inner portion of post 120 and external insulative layer 124*b* formed at an outer portion of post 120. Internal and external insulation layers 124*a* and 124*b* are formed through the same process.

Meanwhile, internal insulative layer 124*a* or external insulative layer 124*b* can be omitted, if necessary.

Figure 8H:
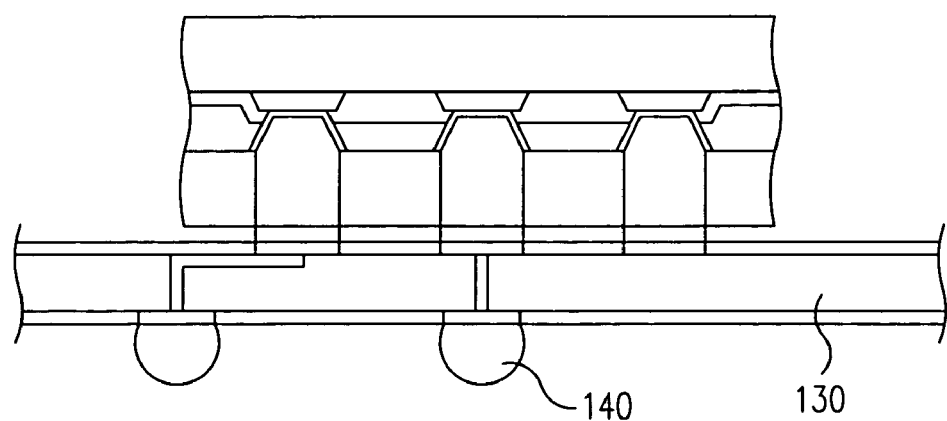

As shown in FIG. 8H, sub-process S80 is carried out in order to bond substrate 130 to post 120. That is, first and second electrically conductive patterns 135 and 136 are bonded to first and second posts 121 and 122 of post 120, respectively, thereby electrically connecting the integrated circuits (not shown) formed in semiconductor die 110 to electrically conductive pattern 132 of substrate 130.

In addition, solder balls 140 are welded to electrically conductive patterns 134 formed at second surface 133 of substrate 130. Accordingly, electric signals of semiconductor die 110 can be transmitted to external devices by connecting solder balls 140 to the external devices.

Figure 8I:
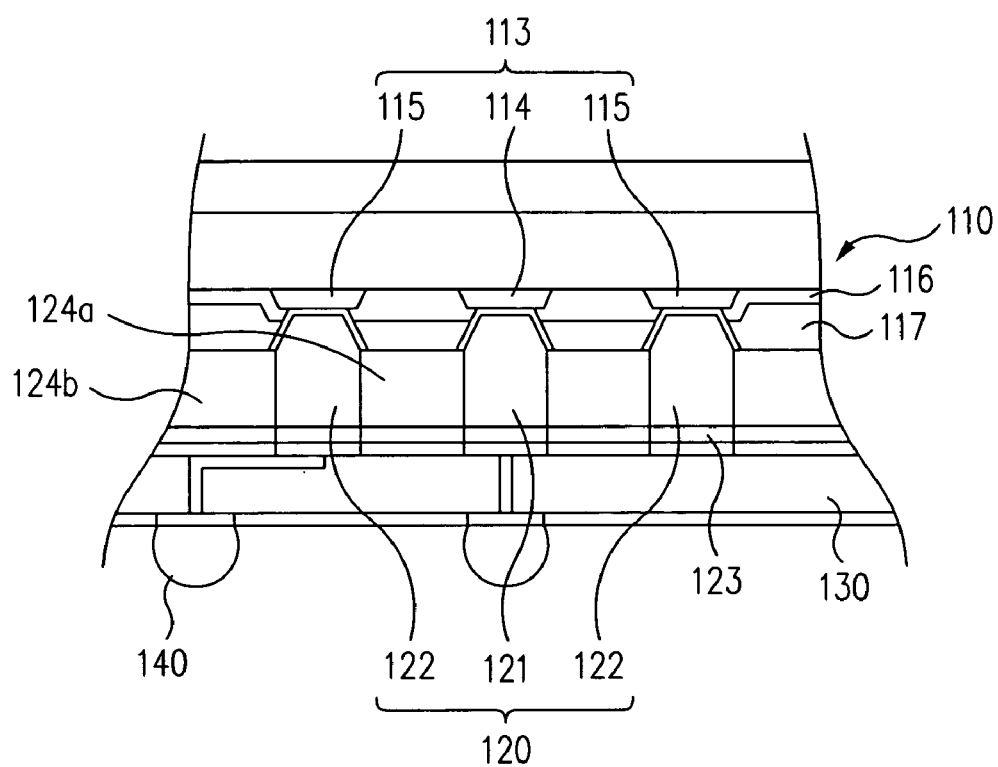

As shown in FIG. 8I, sub-process S90 is for forming encapsulant 150 made from encapsulating material on substrate 130 in order to protect and electrically insulate semiconductor die 110 and post 120 coupled to substrate 130. In one embodiment of the invention, encapsulating maternal includes silicone, EMC or the like. However, the present invention does not limit the material for the encapsulant 150 to the specific materials disclosed.

Although the present invention has been described with reference to the flip-chip assembly package, the packaging method using the post according to the present invention may be also applicable for the wafer level package.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
    a semiconductor die comprising a first surface having an approximately planar shape and a second surface formed in opposition to the first surface and having a plurality of bond pads, each bond pad comprising a first bond pad formed at a center of the bond pad and a second bond pad spaced from the first bond pad by a predetermined distance while at least partially surrounding the first bond pad;
    a substrate comprising a first surface having an approximately planar shape and a second surface formed in opposition to the first surface, the first surface of the substrate being formed with a plurality of electrically conductive patterns having shapes corresponding to shapes of the bond pads;
    a plurality of posts comprising a first post formed on the first bond pad and a second post formed on the second bond pad; and
    an internal insulative layer formed between the first post and the second post of the plurality of posts, the insulative layer having a height approximately equal to a height of the first post, wherein;
    the plurality of posts comprising a first post formed on the first bond pad and a second post formed on the second bond pad are bonded to the electrically conductive patterns of the substrate so as to electrically connect the substrate to the semiconductor die.

2. The semiconductor package of claim 1, further comprising:
    an encapsulant formed on the first surface of the substrate.

3. The semiconductor package of claim 1, wherein;
    the first bond pad of the semiconductor die has a substantially circular sectional shape and the second bond pad of the semiconductor die has a substantially ring shape having a predetermined width.

4. The semiconductor package of claim 3, wherein;
    an opening is formed in the second bond pad.

5. The semiconductor package of claim 1, further comprising:
    a UBM layer formed on a surface of the bond pad.

6. The semiconductor package of claim 5, wherein;
    the UBM layer comprises Ti and Cu.

7. The semiconductor package of claim 1, wherein;
    a solder layer is formed on a surface of the post and surfaces of the electrically conductive patterns of the substrate, respectively.

8. The semiconductor package of claim 1, wherein;
    the post is made from Cu.

9. The semiconductor package of claim 1, further comprising:
    an external insulative layer formed at an outer portion of the second post.

10. The semiconductor package of claim 1, wherein;
    first and second electrically conductive patterns of the substrate have shapes corresponding to shapes of the first and second bond pads of the semiconductor die.

11. The semiconductor package of claim 1, wherein;
    the substrate is selected from the group consisting of a lead frame, a printed circuit board, a circuit tape and a circuit film.

12. A semiconductor package comprising:
    a semiconductor die comprising a first surface having an approximately planar shape and a second surface formed in opposition to the first surface and having a plurality of bond pads, wherein each bond pad includes a first bond pad formed at a center of the bond pad and a second bond pad spaced from the first bond pad by a predetermined distance while surrounding the first bond pad
    a plurality of posts comprising a first post formed on the first bond pad and a second post formed on the second bond pad; and
    an internal insulative layer formed between the first post and the second post of the plurality of posts, the insulative layer having a height approximately equal to a height of the first post.

13. The semiconductor package of claim 12, wherein;
    the first bond pad of the semiconductor die has a substantially circular sectional shape and the second bond pad of the semiconductor die has a substantially ring shape having a predetermined width.

14. The semiconductor package of claim 13, wherein;
    an opening is formed in the second bond pad.

15. A semiconductor package comprising:
    a semiconductor die comprising a first surface having an approximately planar shape and a second surface formed in opposition to the first surface and having a plurality of bond pads, each bond pad comprising a first bond pad formed at a center of the bond pad and a second bond pad spaced from the first bond pad by a predetermined distance while at least partially surrounding the first bond pad;
    a substrate comprising a first surface having an approximately planar shape and a second surface formed in opposition to the first surface, the first surface of the substrate being formed with a plurality of electrically conductive patterns having shapes corresponding to shapes of the bond pads;
    a plurality of posts comprising a first post formed on the first bond pad and a second post formed on the second bond pad; and
    an internal insulative layer formed between the first post and the second post of the plurality of posts, the insulative layer having a height approximately equal to a height of the first post, wherein;

the plurality of posts comprising a first post formed on the first bond pad and a second post formed on the second bond pad are bonded to the electrically conductive patterns of the substrate so as to electrically connect the substrate to the semiconductor die wherein;

the first bond pad of the semiconductor die has a substantially circular sectional shape and the second bond pad of the semiconductor die has a substantially ring shape having a predetermined width; further wherein;

first and second electrically conductive patterns of the substrate have shapes corresponding to shapes of the first and second bond pads of the semiconductor die.

16. The semiconductor package of claim 15, further comprising:

an encapsulant formed on the first surface of the substrate.

17. The semiconductor package of claim 15 wherein the first post is electro-plated with Cu.

* * * * *